US006855891B2

(12) United States Patent
Eguchi et al.

(10) Patent No.: US 6,855,891 B2
(45) Date of Patent: Feb. 15, 2005

(54) CARD EDGE CONNECTOR, METHOD OF MANUFACTURING SAME, ELECTRONIC CARD AND ELECTRONIC EQUIPMENT

(75) Inventors: Susumu Eguchi, Kawasaki (JP); Hiroshi Shimamori, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/107,200

(22) Filed: Mar. 28, 2002

(65) Prior Publication Data

US 2003/0079907 A1 May 1, 2003

(30) Foreign Application Priority Data

Oct. 31, 2001 (JP) ......................................... 2001-335403

(51) Int. Cl.[7] ................................................. H05K 1/00
(52) U.S. Cl. ...................................... 174/250; 174/258
(58) Field of Search ................................ 174/250–251, 174/258; 361/801–802; 439/59–62, 67, 951

(56) References Cited

U.S. PATENT DOCUMENTS

| 2,959,758 A | * | 11/1960 | Geshner et al. | 174/261 |
| 4,095,866 A | * | 6/1978 | Merrill | 174/262 |
| 4,298,237 A | * | 11/1981 | Griffith et al. | 439/60 |
| 4,303,291 A | * | 12/1981 | Dines | 174/261 |
| 4,806,103 A | * | 2/1989 | Kniese et al. | 439/60 |
| 5,044,980 A | * | 9/1991 | Krumme et al. | 439/433 |
| RE35,508 E | * | 5/1997 | Lemke et al. | 439/101 |
| 5,772,448 A | * | 6/1998 | Ekrot et al. | 439/60 |

FOREIGN PATENT DOCUMENTS

| JP | 60-20482 | 2/1985 |
| JP | 2-106693 | 8/1990 |
| JP | 3-126289 | 5/1991 |

OTHER PUBLICATIONS

Merriam Webster's Collegiate Dictionary (10th).*

* cited by examiner

Primary Examiner—Kamand Cuneo
Assistant Examiner—Tuan Dinh
(74) Attorney, Agent, or Firm—Westerman, Hattori, Daniels & Adrian, LLP

(57) ABSTRACT

A card edge connector comprises a connector body and a conductive pad, and is constructed such that the conductive pad terminates at a predetermined distance from the end of the tip portion of the connector body, and that there is further provided a protective pad, adjacent to the terminating portion of the conductive pad, which is formed at the same time with the formation of a wiring pattern in a post-fabrication step of the wiring pattern. Using the card edge connector, an electric card and an electric equipment are also provided.

23 Claims, 10 Drawing Sheets

CARD EDGE CONNECTOR, METHOD OF MANUFACTURING SAME, ELECTRONIC CARD AND ELECTRONIC EQUIPMENT

BACKGROUND OF THE INVENTION

1. Field of the Invention

The present invention relates to a card edge connector and, more particularly, to a card edge connector used for inserting and fitting an electronic card, that has an electronic device packaged thereon, into a connector of an electronic equipment. The present invention also relates to a method of manufacturing the, card edge connector, and to an electronic card and an electronic equipment using the card edge connector.

2. Description of Related Art

As is well known in the art, when a card-shaped printed circuit board is to be implemented in an electronic equipment, a generally adopted method is to provide a card edge connector at an end portion of the printed circuit board, and to insert and fit the card edge connector into a connector of the electronic equipment.

FIG. 1 is a sectional view showing an example of a prior art card edge connector and illustrating the use thereof. In the illustrated example, a construction is adopted such that an electronic equipment is provided with a connector 51 having a socket structure, and a card edge connector 53 as a plug is directly inserted and fitted into the connector 51. The connector 51 has a plurality of wire-type connector contacts 54 in the socket portion into which the card edge connector is to be inserted. On the other hand, the card edge connector 53 is formed integrally with a printed circuit board (not shown) at an end thereof, and has electrode contacts 55 corresponding to the connector contacts 54 disposed with wirings on both sides of its body 56. When the card edge connector 53 is inserted into the connector 51 and fitted into it, the electrode contacts 55 are pressed onto the connector contacts 54, so as to achieve electrical connection between them. In the case of the card edge connector 53 as shown in FIG. 1, however, a large force is required for insertion into and extraction from the connector, and this may sometime cause damage to the connector portion due to excessive force exerted in the operation. This is caused by the shape of the connector body 56 which is prismatic at the end corner as shown by the arrow A. There is also a problem with the electrode contacts 55 that metal debris may fall off at the segment 55a.

In order to overcome problems associated with the excessive force exerted during insertion and extraction of the card edge connector, it has been known to chamfer the end of the connector body 56 to remove the prismatic corner edge thereof as shown in FIG. 2. However, in the card edge connector 53 as shown in FIG. 2, the terminating portions of the electrode contacts 55 are of a prismatic shape as shown by an arrow B so that difficulties may arise in the insertion of the connector, and problems may often arise in the insertion and extraction of the connector such as separation of the contacts, breaking of the prismatic edge and the falling-off of fine metal debris. When the fine metal debris of the electrode contacts enters into inside of the electronic equipment, serious problems, for example, an electrical short circuit or the like, may arise. Although it has been proposed to form the electrode contacts 55 as a thin film deposited on the card edge connector 53 in order to avoid the falling-off of metal debris, this method is not a feasible solution because, with increase of the amount of information processed, current electronic equipment is generally required to be able to pass a correspondingly large current. Countermeasures such as a shift in terminating position of the electrode contacts 55, a change of the angle of chamfering at the end of the connector body 56, or the like, do not lead to an essential solution of the problem.

FIG. 3 shows a card edge connector that has been developed in order to solve the above described problems. In this card edge connector 53, the end of the connector body 56 is cut in the shape of wedge to form an inclined surface 56a so as to make it easy to insert the electrode contacts 55 between the connector contacts 54. In this cutting operation, the electrode contacts 55 are also cut to obtain the effect of removing the prismatic edge of the contacts. However, in cutting of the electrode contacts 55, burrs may arise in the corner portion shown by an arrow C, giving rise to another problem that a finishing operation to remove the burrs is necessary. Also, in the case of a card edge connector of such a construction, the inclined surface 56a formed by the cutting is a rough surface so that repeated insertion and extraction of the connector tends to damage the connector contacts 55.

FIG. 4 is a view showing a card edge connector that has been developed to resolve the problems as described above. In this card edge connector 53, after the end of the connector body 56 is cut in a shape of wedge to form a rounded inclined surface, electrode contacts 55 are formed so as to cover almost whole of the inclined surface. Thus, the electrode contacts 55 are formed continuously from the wired surface of the printed circuit board to the end surface at the tip of the connector body 56. However, in the case of this card edge connector, multiple steps are required in the manufacturing process, and the manufacturing operation becomes very complicated leading, inevitably, to an increase in cost.

SUMMARY OF THE INVENTION

The object of the present invention is to solve various problems, as described above, associated with the prior art card edge connector.

It is a first object of the present invention to provide a card edge connector which requires a smaller force than before for insertion and extraction and therefore permits insertion and extraction operation to be carried out easily, and which does not give rise to broken debris of component members during such an operation and can thus prevent occurrence of an electrical short circuit due to such a debris, and which can be manufactured easily and at a low cost.

It is another object of the present invention to provide a method of making such a card edge connector in a simple manner and at a low cost and with a high yield.

It is still another object of the present invention to provide an electronic card which permits insertion and extraction operation to be carried out easily, and which does not give rise to a broken debris of component members during such an operation and can thus prevent occurrence of an electrical short circuit due to such a debris.

It is a further object of the present invention to provide an electronic equipment comprising an electronic card which permits insertion and extraction operation to be carried out easily, and which does not give rise to broken debris of component members during such an operation and can thus prevent occurrence of an electrical short circuit due to such a debris.

Above and other objects of the present invention will become more apparent from a detailed description that follows.

According to an aspect of the present invention, there is provided a card edge connector used for inserting and fitting an electronic card into a connector of an electronic equipment, comprising:

a connector body having a tip portion with shape and dimension corresponding to a receiving portion of the connector of the electronic equipment, and a conductive pad formed in a predetermined pattern on at least one major surface of the connector body;

wherein the conductive pad terminates at a predetermined distance from the end of the tip portion of the connector body, and adjacent to the terminating portion of the conductive pad, there is further provided a protective pad that is formed at the same time with the formation of a wiring pattern for said electronic card in the post-fabrication step of the wiring pattern.

According to another aspect of the present invention, there is provided a card edge connector used for inserting and fitting an electronic card into a connector of an electronic equipment, comprising:

a connector body having a tip portion with shape and dimension corresponding to a receiving portion of the connector of the electronic equipment, and a conductive pad formed in a predetermined pattern on at least one major surface of the connector body;

wherein the conductive pad has prismatic corner edge of its terminating portion removed by means of press working.

According to still another aspect of the present invention, there is provided a method of manufacturing a card edge connector used for inserting and fitting an electronic card into a connector of an electronic equipment, comprising the steps of:

making a connector body having a tip portion with a shape and a dimension corresponding to a card receiving port of the connector of the electronic equipment;

forming a conductive pad in a predetermined pattern on at least one major surface of the connector body, wherein the conductive pad is shaped to terminate at a predetermined distance from the end of the tip portion of the connector body; and forming a protective pad adjacent to the terminating portion of the conductive pad together with a wiring pattern for the electronic card in a post-fabrication step of the wiring pattern.

Similarly, according to another aspect of the present invention, there is provided a method of manufacturing a card edge connector used for inserting and fitting an electronic card into a connector of an electronic equipment, comprising the steps of:

making a connector body having a tip portion with a shape and a dimension corresponding to a card receiving port of the connector of the electronic equipment;

forming a conductive pad in a predetermined pattern on at least one major surface of the connector body, wherein the conductive pad is shaped to terminate at a predetermined distance from the end of the tip portion of the connector body; and removing prismatic corner edge of the terminating portion of the conductive pad by means of press working.

Further, the present invention is directed to the use of the card edge connector of the invention.

According to another aspect thereof, the present invention resides in an electronic card comprising the card edge connector of the present invention.

According to still another aspect thereof, the present invention resides in an electronic equipment having an electronic card comprising the card edge connector of the present invention.

DESCRIPTION OF THE PREFERRED EMBODIMENTS

Figure 1:
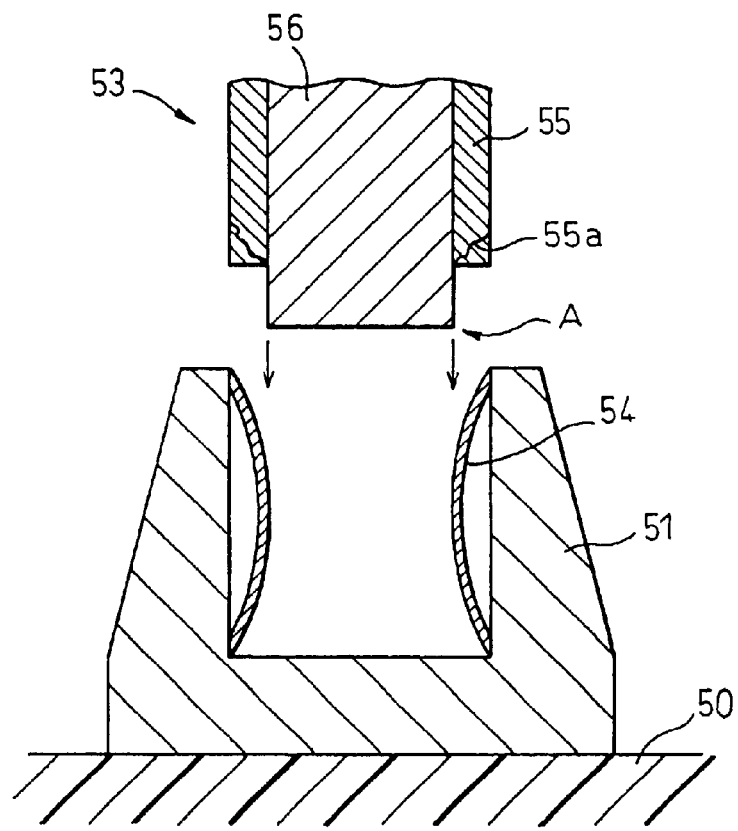
FIG. 1 is a sectional view showing an example of a prior art card edge connector and usage thereof.
Figure 2:
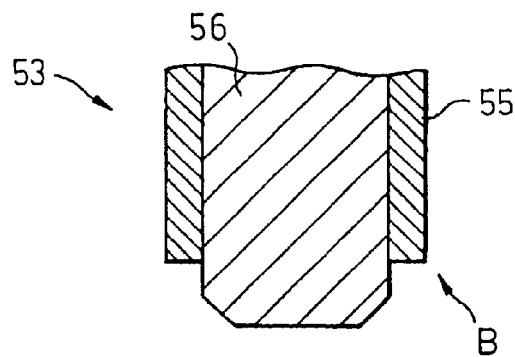
FIG. 2 is a sectional view showing another example of a prior art card edge connector.
Figure 3:
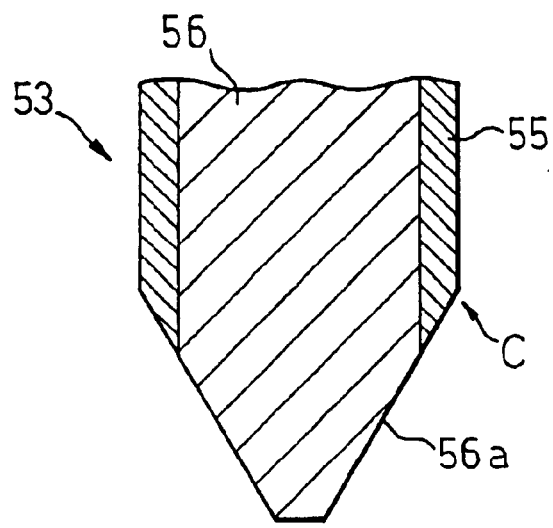
FIG. 3 is a sectional view showing still another example of a prior art card edge connector.
Figure 4:
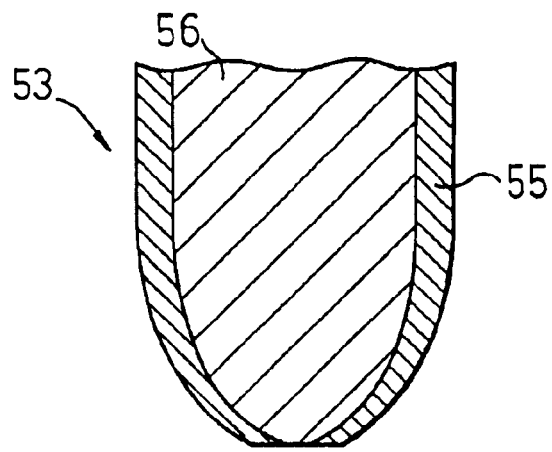
FIG. 4 is a sectional view showing still another example of a prior art card edge connector.

As has been described above, the present invention resides in a card edge connector for electrical connection and a method of manufacturing the same, and to an electronic card and an electronic equipment comprising the card edge connector of the invention.

The card edge connector of the present invention is used for inserting and fitting an electronic card, e.g. a memory card, having an electronic device such as a LSI chip packaged thereon, into a connector provided on a substrate such as a mother board of a semiconductor apparatus so as to establish electrical connection between the electronic card and the semiconductor apparatus.

As used herein, the term "electronic device" means various devices generally mounted on a semiconductor apparatus or other apparatus, specifically including, but not limited to, a semiconductor device such as an IC chip and a LSI chip, a capacitor, a transformer, a choke coil, a printed board, etc. An electronic device in its broad sense includes attached wirings and electrodes. The term "electronic card" as used herein means various card-shaped elements having an electronic device mounted thereon, such as a memory card, a printed circuit board, etc. The term "electronic equipment" means various equipments or devices having at least one electronic device mounted or packaged thereon, including, for example, a printed circuit board unit, a DC-DC converter power supply, etc.

A card edge connector according to the present invention can be used in various locations. Usually, however, it is installed at one end of an electronic card, that is, at one edge of an electronic card that is to be inserted into a card receiving port of a connector (a connector having a socket function) of an electronic equipment. Electrode terminals are usually disposed in this part of an electronic card. The card edge connector is typically used as an integral part of the electronic card. A card edge connector according to the present invention may be used, as required, in combination with an electronic part or a part other than an electronic card.

Typically, a card edge connector is provided in the form of a card. Thus, a body of the card edge connector is generally in the form of a rectangular parallelopiped, preferably having a tip portion of a shape-and dimension corresponding to a card receiving port of a connector of an electronic equipment so as to be inserted and fitted into it. Therefore, the connector body is preferably the same as the body of the electronic card, usually the printed circuit board or similar substrate.

The connector body can be made of various materials ordinarily used for a printed circuit board or the like. Suitable materials include, but not limited to, plastic materials such as glass epoxy resin, polyimide resin, polycarbonate resin, etc., ceramic materials such as silicon, etc., and metal such as aluminum, etc. A laminated or composite material made from these substances may be used as required.

Size of the connector body may be widely varied depending on the details of the electronic card to which it is installed or on the size of the card receiving port of the electronic equipment into which it is to be inserted and fitted.

The tip portion of the connector body (the portion to be inserted and fitted into a connector of an electronic equipment) may be used with no further processing and with prismatic corner edge being left as it is at the end. However, in view of ease of handling in insertion and extraction, and prevention of the falling-off of metal debris, it is preferable to chamfer the tip portion. The chamfering pattern of the tip portion of the connector body may be varied. Typically, it is preferable to chamfer at such an angle as to leave about ⅓ of the end surface. The depth of chamfering (distance from the end surface) may be widely varied depending on the detail of the electronic card and the size of the card receiving port of the electronic equipment.

In the card edge connector of the present invention, a conductive pad is formed in a predetermined pattern on at least one major surface, preferably on both major surfaces, of the connector body. This conductive pad is pressed onto the mating connector contacts of the electronic equipment to achieve the desired electrical connection.

The conductive pad usually constitutes an electrode terminal and terminates at a predetermined distance from the end of the tip portion of the connector body, that is, without extending continuously to the end of the tip portion, although another form may be adopted in some cases.

The conductive pad of the card edge connector may be formed in any suitable manner from various conductive materials depending on the type of connectors. In general, the conductive pad is advantageously formed using conductive materials and a method usually adopted in forming wiring pattern or electrode pattern in the manufacture of electronic cards or other semiconductor apparatuses. Preferably, the conductive pad is integrally formed together with the wiring pattern so as to simplify and reduce the number of manufacturing processes and the cost.

Suitable conductive materials used for forming the conductive pad include, for example, copper, gold, aluminum, or an alloy thereof. Methods of forming the conductive pad include, but are not limited to, an etching method, a plating method such as elecrolytic plating, electroless plating, or their combination, a deposition method, a sputtering method and adhesion and selective removal of a conductor foil.

The pattern and size of the conductive pad may be widely varied depending on the details of the card edge connector. For example, the pattern of the conductive pad may be constructed in accordance with the wiring pattern to which it is connected. If necessary, a resist process as used in the manufacture of semiconductor devices may be adopted for patterning of the conductive pad. The size of the conductive pad may also be adjusted to the size of the wiring pattern. For example, it is preferred that the thickness of the conductive pad is usually in the range of 70 to 100 $\mu$m. In the card edge connector of the present invention, even if the conductive pad is relatively thick so that it is suitable in the application of a large current, metal debris is not produced as in the prior art. It is to be understood that a thinner conductive pad is not excluded in the card edge connector of the present invention.

In the card edge connector of the present invention, according to one aspect, there is further provided a protective pad adjacent to the terminating portion of the conductive pad. The protective pad has functions of relieving the shock (shock absorption) during insertion and extraction of electronic card to and from the connector, and of protecting the end surface of the conductive pad.

The protective pad may be disposed in various forms adjacent to the terminating portion of the conductive pad. For example, it may be applied in a form of spots at the terminating portion of the conductive pad, or it may be applied in a form of thin film on the surface of the connector body. In the case of thin film protective pad, the thickness of the protective pad may be approximately equal to that of the conductive pad, or the protective pad may be formed thicker or thinner that the conductive pad. In short, the protective pad may be of an arbitrary thickness as long as it can achieve the desired function. Also, a leading edge of the protective pad may terminate at a relatively short distance, or it may extend to the end of the inclined surface formed by chamfering of the connector body. The trailing edge of the protective pad may also extend so as to cover the terminating portion of the conductive pad.

In the card edge connector of the present invention, the protective pad may be formed from various materials. Preferably, however, the protective pad is formed from cured resin materials in view of film forming-properties. Suitable resin materials used for forming the-protective pad include, but are not limited to, polyimide resins. These resin materials may be used alone or in combination of two or more of them. In place of these resin materials, conventional resist materials, such as solder resist materials, for example, "PSR-4000" (Trade name, manufactured by Taiyo Ink Co.), may be used. A material which is typically used for forming anti-humidity coating, for example, "Hayacoat MODEL AY-1000" (Trade name, manufactured by Sunhayato Co.), may also be used.

The protective pad may be formed using various methods. For example, a screen printing method may be advantageously used in view of ease of film forming and possibility of simultaneous formation with other parts. The protective pad is preferably formed simultaneously with the step of formation of wiring pattern of the electronic card. This will simplify the manufacturing processes and reduce the manufacturing cost. In particular, the protective pad is preferably formed at the same time as the formation of the wiring pattern of the electronic card in the post-fabrication processing (for example, application of a solder-resist coating) of the wiring pattern.

According to another aspect, in the card edge connector of the present invention, the conductive pad preferably has the terminating portion from which the prismatic corner edge was removed by press working. Unexpectedly, by removing the prismatic edge from the terminating portion of the conductive pad, an operative effect comparable to the provision of above-described protective pad can be achieved.

The present invention also resides in a method of manufacturing the card edge connector as described above. The method of manufacturing the card edge connector of the present invention comprises the steps of:

making a connector body having a tip portion with a shape and dimensions corresponding to a card receiving port of a connector of an electronic equipment;

forming a conductive pad in a predetermined pattern on at least one major surface of the connector body, wherein the conductive pad is shaped to terminate at a predetermined distance from the end of the tip portion of the connector body; and, depending on the intended construction of the card edge connector;

forming a protective pad adjacent to the terminating portion of the conductive pad along with a wiring pattern for the electronic card in the post-fabrication step of the wiring pattern, or removing the prismatic corner edge from the terminating portion of the conductive pad by means of press working.

In the manufacturing method as described above, the step of removing a prismatic edge from the terminating portion of the conductive pad may be carried out using an ordinary press machine. Optimal conditions of the press working may be selected taking various factors into account.

The present invention also resides in an electronic card having at least one electronic device packaged thereon. The electronic card according to the present invention comprises the card edge connector of the present invention having installed in the insertion edge at an end face thereof.

The electronic card is preferably formed integrally with the card edge connector. As has been described before, the electronic card encompasses various types of card, including as a suitable example, a printed circuit board having a semiconductor device such as a LSI chip mounted thereon.

The present invention further resides in an electronic equipment having an electronic card comprising the card edge connector of the present invention. As the electronic card of the present invention is mounted on the electronic equipment, it is preferred that the electronic card and the card edge connector are integrally formed, and that the electronic card is a printed circuit board having a semiconductor device mounted thereon.

Now, the present invention will be described with reference to drawings showing embodiments thereof. It is to be understood that the present invention is not limited by these embodiments.

Figure 5:
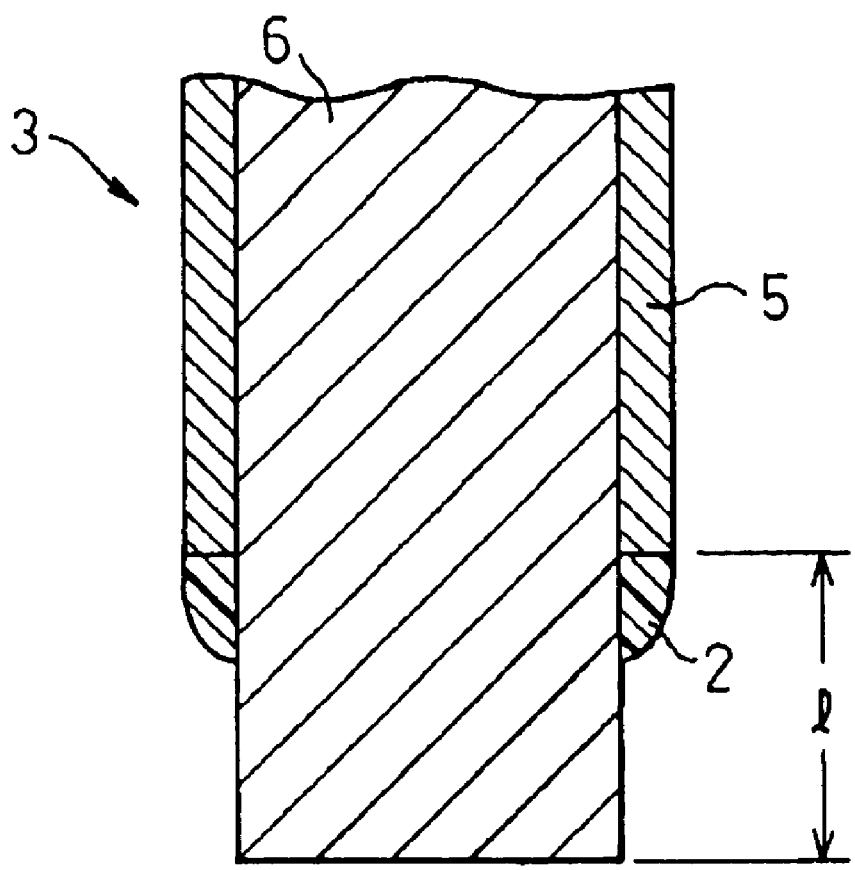
FIG. 5 is a sectional view of a card edge connector according to a preferred embodiment of the present invention.

FIG. 5 is a sectional view showing a card edge connector according to a preferred embodiment of the present invention. The card edge connector 3 shown in this figure is integrally installed to the insertion end of a card-shaped printed circuit board (not shown), and is comprised of a connector body 6 and a conductive pad 5. The connector body 6 is in the extension of the printed circuit board, and is therefore made of the same glass epoxy resin as the substrate of the printed circuit board. The connector body 6 is, as shown in the Figure, in the form of a card, and its tip portion has shape and dimension corresponding to the socket (card receiving port) of a connector of a semiconductor equipment (not shown) so as to be inserted and fitted into it. On the opposing surfaces of the connector body 6 (sides of the connector body when inserted into the socket), the conductive pad 5 is formed in a predetermined pattern.

The conductive pad 5 is formed by etching a copper foil adhered to the connector body 6. The conductive pad 5 terminates at a predetermined distance (l) from the end of the tip portion of the connector body 6 so that, when fitted into the socket of the connector of the semiconductor equipment, it is pressed onto the connector contacts in the socket. In the shown example, the tip portion of the connector body 6 is not yet processed, and the prismatic edge is not yet chamfered. In the present invention, even when such a prismatic edge remains, an operative effect worthy of evaluation can be obtained.

In addition, the card edge connector 3 has a protective pad 2 formed adjacent to the terminating portion of the conductive pad 5. The protective pad 2 protects the terminating portion of the conductive pad 5 from shock etc., and has not only a shock absorbing effect, but also a function of assisting fitting of the connector body 6 into the socket. The protective pad 2 as shown is simultaneously formed together with a solder-resist in a process where a solder-resist is applied onto wiring pattern of the printed circuit board in screen printing and then cured. In place of such a resin, a photo-resist may be applied and cured so as to form, by patterning, the protective pad 2 in a desired pattern. By disposing the protective pad 2 in this way, separation of the end surface of the conductive pad 5 of the connector during insertion and extraction of the connector can be effectively avoided.

Figure 6:
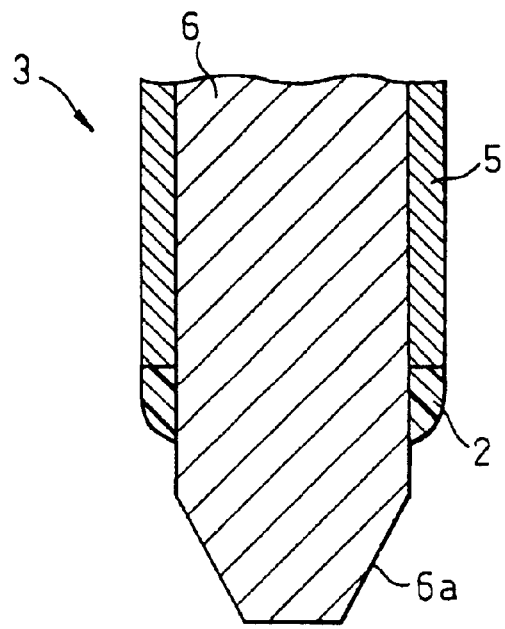
FIG. 6 is a sectional view of a card edge connector according to another preferred embodiment of the present invention.

FIG. 6 is a sectional view showing a card edge connector according to another preferred embodiment of the present invention. In this card edge connector 3, the tip portion of the connector body 6 is subjected to chamfering process so that the prismatic corner edge thereof is removed to form an inclined surface 6a. The tip portion of the connector body 6 is inclined, making it easier to fit the card edge connector 3 into a socket of a connector of a semiconductor equipment. Separation of the end surface of the conductive pad 5 of the connector can be also effectively avoided.

Figure 7:
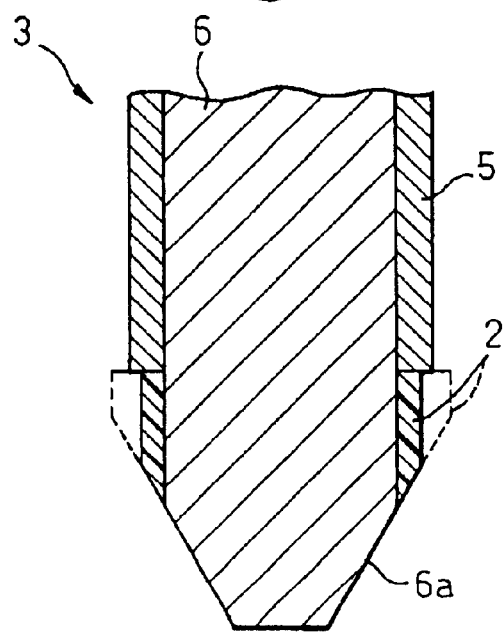
FIG. 7 is a sectional view of a card edge connector according to still another preferred embodiment of the present invention.

FIG. 7 is a sectional view showing a card edge connector according to still another preferred embodiment of the present invention. In this card edge connector 3, in addition to the chamfering process performed on the tip portion of the connector body 6, the chamfering process extends as far as the protective pad 2. In the example shown, the protective pad 2 is also shown in dotted line to indicate that thickness of the protective pad 2 may be smaller or larger than that of conductive pad 5. By extending the inclined surface of the tip portion of the connector body 6 to the protective pad 2, fitting of the card edge connector 3 into the socket of the connector of the semiconductor equipment can be performed more smoothly than before. It will be understood that separation of the end surface of the conductive pad does not occur.

Figure 8:
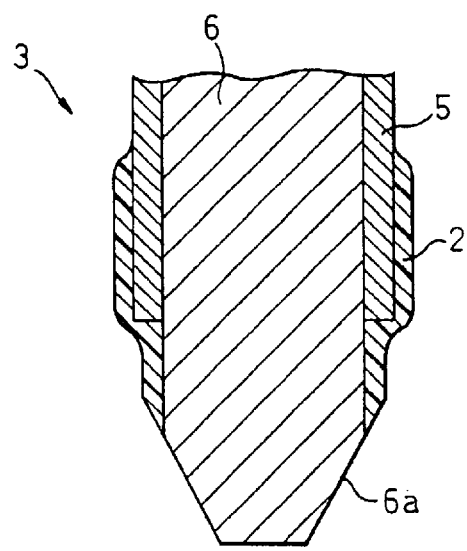
FIG. 8 is a sectional view of a card edge connector according to still another preferred embodiment of the present invention.

FIG. 8 is a sectional view showing a card edge connector according to still another preferred embodiment of the present invention. The card edge connector 3 shown in FIG. 8 is similar to that shown in FIG. 7 except that the leading edge of the conductive pad 5 is covered by the protective pad 2 in order to enhance the operative effect of the protective pad 2. With such a construction, the fitting of the card edge connector 3 into the socket of the connector of the semiconductor equipment becomes significantly easier, and separation of the end of the conductive pad 5 can be effectively avoided. The area of the conductive pad 5 covered by the protective pad 2 should be such that the good contact between the conductive pad 5 and the connector contacts in the socket is not obstructed.

Figure 9:
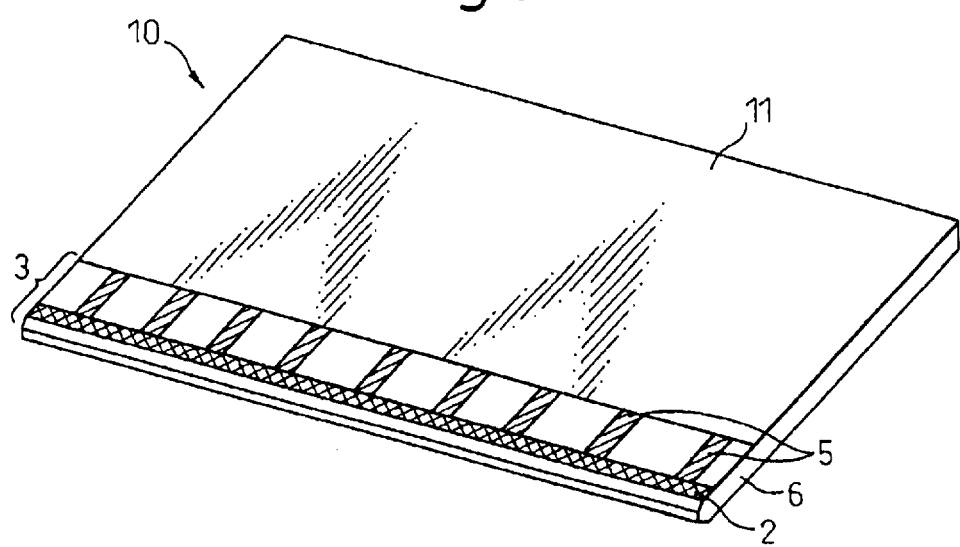
FIG. 9 is a perspective view showing an example of an electronic card comprising the card edge connector shown in FIG. 8.

FIG. 9 is a perspective view showing an example of an electronic card comprising the card edge connector shown in FIG. 8. The electronic card 10 shown in this figure is comprised of a card-like printed circuit board 11 having a LSI chip (not shown) mounted thereon. A card edge connector 3 is installed integrally to one edge of the printed circuit board 11. The card edge connector 3 includes a conductive pad 5 covered with the protective pad 2. As can be seen from the figure, the conductive pad 5 in FIG. 8 has its leading edge covered with the protective pad 2.

As has been explained before, in the electronic card of FIG. 9, it is important that the protective card 2 is simultaneously formed together the wiring pattern in the post-fabrication of the wiring pattern of the electronic card. This will be explained below with reference to FIGS. 10A to 10F and FIGS. 11 and 12. The example shown is only illustrative, and in FIGS. 10A to 10F, the card edge connector is not chamfered at the tip portion for the sake of better understanding.

Figure 11:
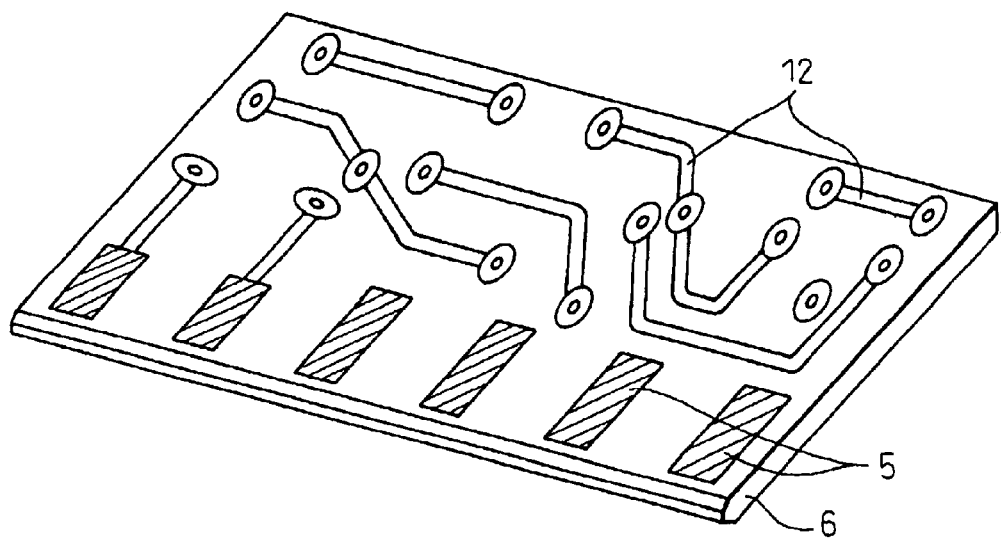
FIG. 11 is a perspective view showing the electronic card shown in FIG. 9 in the course of a manufacturing process.

First, following the general procedure for manufacturing a card-shaped printed circuit board, a wiring pattern 12 is formed on both surfaces of the connector body (substrate) 6, and a conductive pad 5 is formed on the connector body 6. This process may be advantageously carried out, for example, by adhering copper foil beforehand and by selectively etching it in a desired pattern. The substrate (connector body) 6 as shown in FIG. 11 can be obtained in this way.

Figure 10A:
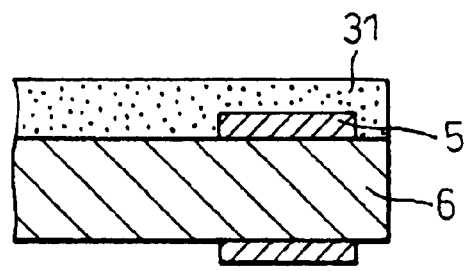
FIGS. 10A to 10F are sectional views showing, in sequence, steps of manufacturing a card edge connector shown in FIG. 8.

Next, as shown in FIG. 10A, a resist material (a solder resist is used here) 31 is applied to the entire front surface of the connector body 6. A screen printing method can be advantageously used as application means. The thickness of the resist film is optimally in the range of 20 to 25 $\mu$m in dry film thickness on the circuit. It is to be understood that thickness of resist film can be varied arbitrarily depending on the desired result.

Figure 10B:
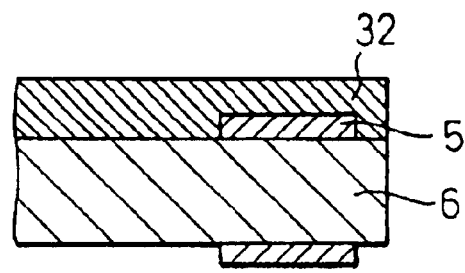

Then, as shown in FIG. 10B, the resist film is pre-dried to form a dry resist film 32. The pre-drying process can be carried out, for example, by using a far infrared oven or a heated air stream oven.

Figure 10C:
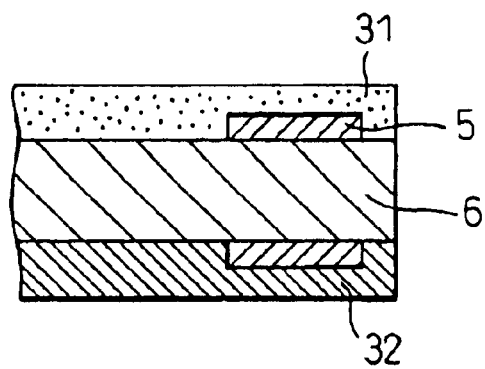
Figure 10D:
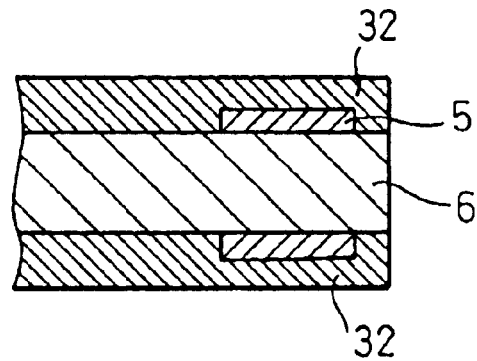

Then, as shown in FIGS. 10C and 10D, application of the resist material and pre-drying are also carried out on the back surface of the connector body 6. As shown in FIG. 10D, the connector body having a dry resist film on both surfaces is thus obtained.

Next, the dry resist film is exposed to UV radiation, developed and post-cured.

Figure 10E:
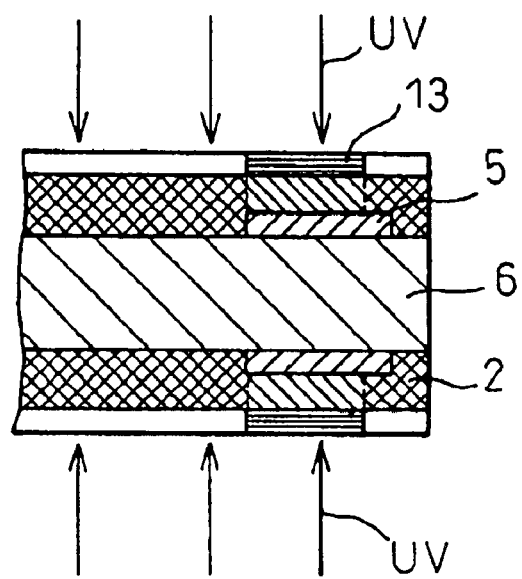

First, as shown in FIG. 10E, both surfaces of the connector body 6 are simultaneously exposed to ultraviolet radiation (UV) in the presence of a negative mask 13. An exposure apparatus using a generally used ultra-high pressure mercury lamp may be used in the exposure step. Amount of exposure may be, for example, 450 to 900 mJ/cm$^2$(illumination of 15 mw/cm$^2$ for 30 to 60 seconds). As a result of the exposure, the exposed portion of the film is cured to form a cured resist film.

Then, the dry resist film (unexposed portion) is developed to be dissolved and removed. A dedicated alkaline developing solution can be used for development. For example, the developing solution is sprayed for 30 to 60 seconds for development. Then, the cured resist film is post-cured. Post-curing process is can be carried out, for example, by using a far infrared oven or a hot air stream oven.

Figure 10F:
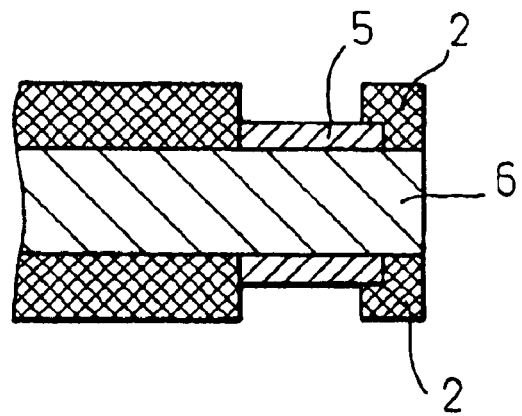
Figure 12:
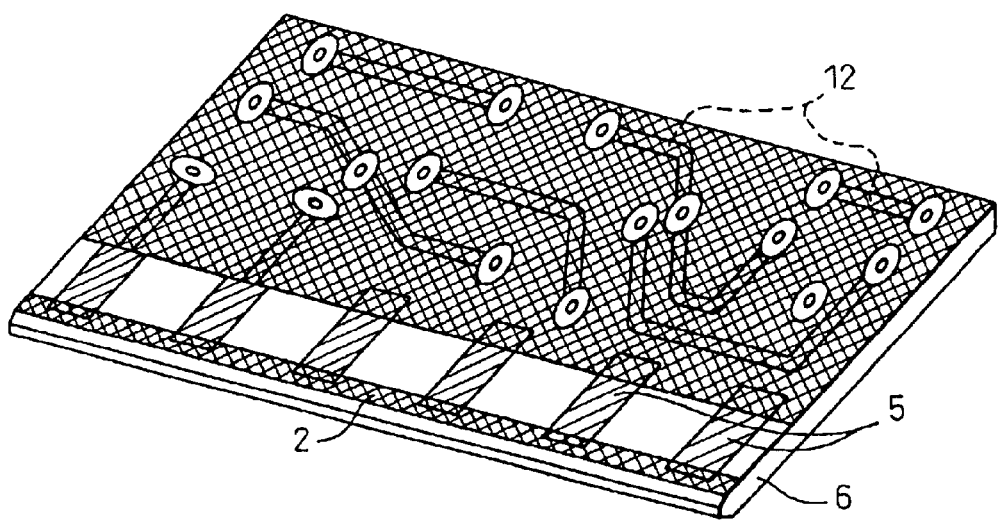
FIG. 12 is a perspective view showing the electronic card shown in FIG. 9 in the course of a manufacturing process.

After a series of processes as described above, the connector body 6 with the conductive pad 5 covered by the protective pad 2 is obtained, as shown in FIG. 10F. This can be seen with the printed circuit board as a whole as shown in FIG. 12. As can be seen in the figure, covering of the wiring pattern 12 by the resist material is carried out simultaneously with the formation of the protective pad 2, and no separate process is required specifically to form the protective pad as in prior art.

Figure 13:
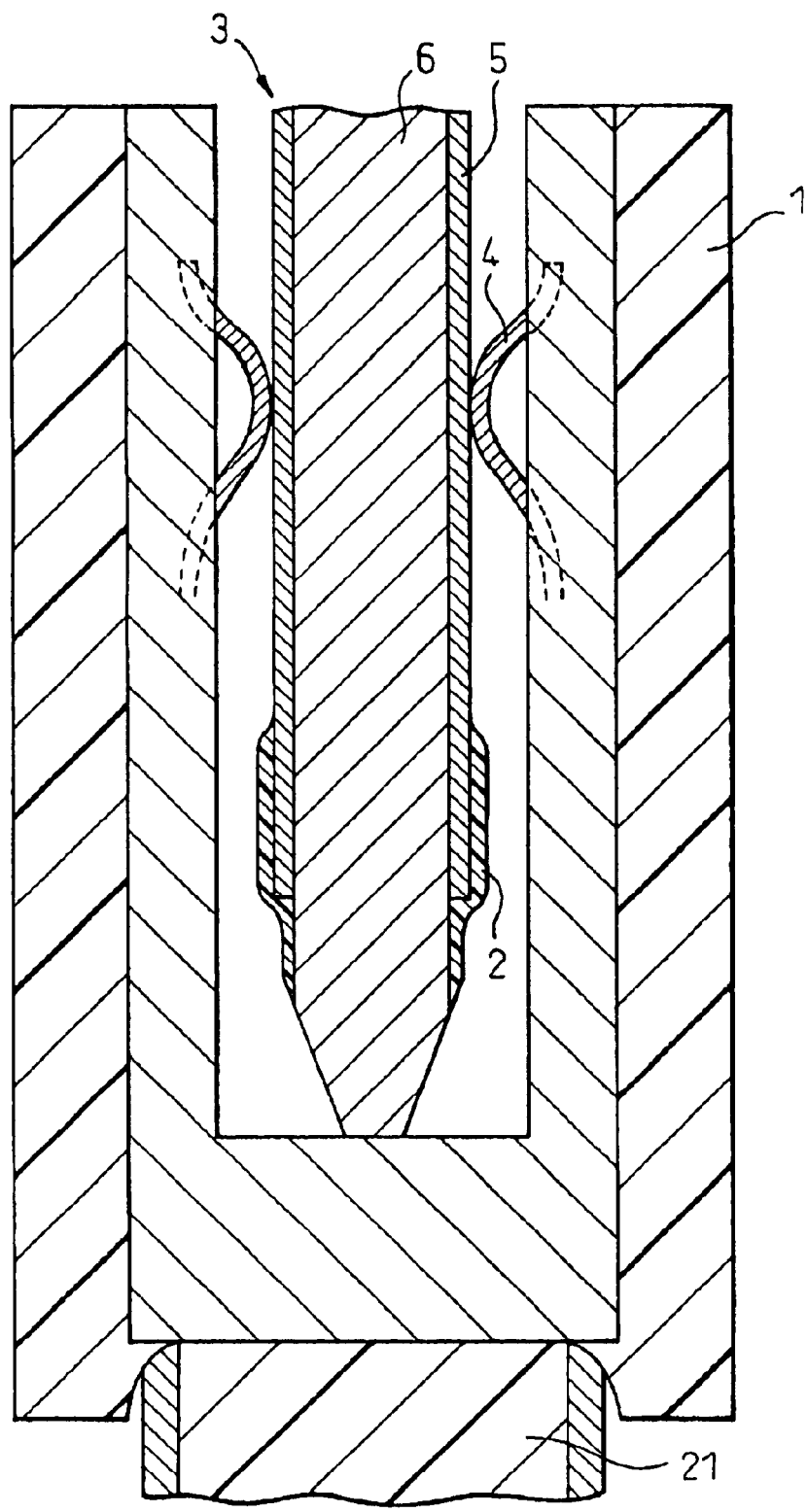
FIG. 13 is a sectional view showing the card edge connector shown in FIG. 8 in the state of usage.

FIG. 13 is a sectional view showing the state of usage of the card edge connector shown in FIG. 8. As shown, the card edge connector 3 is fitted into a socket of the connector 1 installed to the substrate 21 of a semiconductor equipment (not shown). The conductive pad 5 of the card edge connector 3 is pressed onto wire-shaped connector contacts 4 of the connector 1, and a strong electrical connection is thereby secured between the two.

Figure 14:
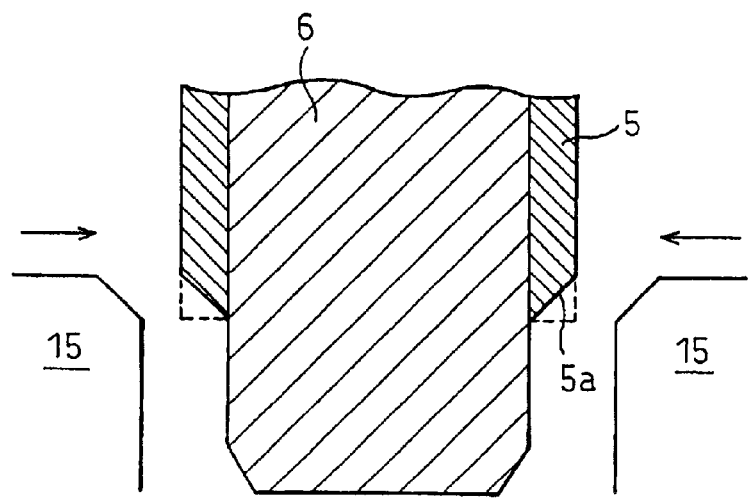
FIG. 14 is a sectional view showing a card edge connector according to still another preferred embodiment of the present invention.

FIG. 14 is a sectional view showing a card edge connector according to still another preferred embodiment of the present invention. In the embodiment shown, instead of disposing a protective pad at the terminating portion of the conductive pad 5 of the card edge connector 3, the terminating portion of the conductive pad 5 is crushed by means of press working to obtain a comparable operative effect. The surface 5a formed by press working is inclined and pressed onto the connector body 6 in such a manner that the card edge connector 3 can be easily fitted into the socket of the connector of the semiconductor equipment and separation of the end surface of the conductive pad can be avoided. In the embodiment shown, a press machine 15 is moved in the direction of arrows to perform press working. Another press machine or processing means may be used as necessary.

Figure 15:
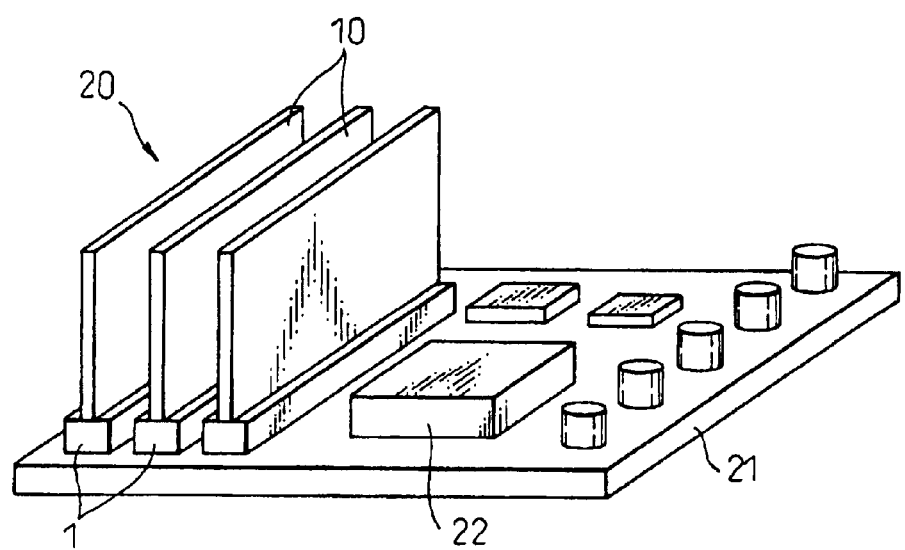
FIG. 15 is a perspective view showing an electronic equipment according to a preferred embodiment of the present invention.

FIG. 15 is a perspective view showing a semiconductor equipment as a preferred embodiment of an electronic equipment of the present invention. The semiconductor equipment 20 has a substrate 21 with one LSI chip 22 mounted thereon, and has connectors 1 each with a card-shaped printed circuit board 10 fitted therein.

As has been described in detail above, according to the present invention, there is provided a card edge connector which requires less force for insertion and extraction and thus permits insertion and extraction operation of an electronic card to be carried out easily, and which does not give rise to a broken debris of component members during such an operation and therefore can avoid occurrence of electrical short circuit due to such debris, and which can be manufactured easily and at low cost.

Also, according to the present invention, such a card edge connector can be manufactured in a simple method and at low cost and with high yield.

Further, according to the present invention, there is provided an electronic card which permits insertion and extraction operation to be carried out easily, and which does not give rise to broken debris of component members during such an operation and therefore can avoid occurrence of an electrical short circuit.

Furthermore, according to the present invention, there is provided an electronic equipment comprising a card edge connector which permits insertion and extraction operation to be carried out easily, and which does not give rise to broken debris of component members during such an operation and therefore can avoid occurrence of an electrical short circuit.

What is claimed is:

1. A card edge connector used for inserting and fitting an electronic card into a connector of an electronic equipment, comprising:

a connector body having a tip portion with shape and dimension corresponding to a card receiving port of said connector of the electronic equipment; and a conductive pad formed in a predetermined pattern on at least one major surface of the connector body;

wherein said conductive pad has a terminating portion at a predetermined distance from the end of said tip portion of the connector body, and wherein, adjacent to said terminating portion of said conductive pad, there is further provided a protective pad consisting of a cured resin or resist material which is formed along with a wiring pattern for said electronic card in the post-fabrication step of the wiring pattern.

2. A card edge connector as described in claim 1, wherein said connector body has chamfered prismatic corner edge at its tip portion.

3. A card edge connector as described in claim 1 or 2, wherein said protective pad is formed as a thin film on the surface of said connector body.

4. A card edge connector as described in claim 3, wherein the leading edge of said protective pad extends to the end of an inclined portion formed by the chamfering of said connector body.

5. A card edge connector as described in claim 4, wherein the trailing edge of said protective pad extends so as to cover the terminating portion of said conductive pad.

6. A card edge connector used for inserting and fitting an electronic card with an electronic device packaged thereon into a connector of an electronic apparatus, comprising:

a connector body having a tip portion with shape and dimension corresponding to a card receiving port of said connector of the electronic apparatus; and a conductive pad formed in a predetermined pattern on at least one major surface of the connector body;

wherein said conductive pad terminates at a predetermined distance from the end of said tip portion of the connector body, and wherein, adjacent to said terminating portion of said conductive pad, there is further provided a protective pad consisting of a cured resin or resist material.

7. A method of manufacturing a card edge connector used for inserting and fitting an electronic card into a connector of an electronic equipment, comprising the steps of:

making a connector body having a tip portion with shape and dimension corresponding to a card receiving port of the connector of said electronic equipment;

forming a conductive pad in a predetermined pattern on at least one major surface of said connector body, wherein said conductive pad is shaped to terminate at a predetermined distance from the end of said tip portion of said connector body; and forming a protective pad consisting of a cured resin or resist material adjacent to the terminating portion of said conductive pad along with a wiring pattern for said electronic card in the post-fabrication step of the wiring pattern.

8. A method of manufacturing a card edge connector as described in claim 7, wherein said protective pad is formed by curing of a resist material.

9. A method of manufacturing a card edge connector as described in claim 7 or 8, wherein the method further comprises the step of:

chamfering said connector body at its tip portion.

10. A method of manufacturing a card edge connector used for inserting and fitting an electronic card into a connector of an electronic equipment, comprising the steps of:

making a connector body having a tip portion with a shape and a dimension corresponding to a card receiving port of the connector of said electronic equipment;

forming a conductive pad in a predetermined pattern on at least one major surface of said connector body, wherein said conductive pad is shaped to terminate it at a predetermined distance from the end of said tip portion of said connector body; and removing a prismatic corner edge of the terminating portion of said conductive pad by press working to crush said terminating portion.

11. A method of manufacturing a card edge connector as described in claim 10, wherein the method further comprises the step of: chamfering said connector body at its tip portion.

12. An electronic card comprising a card edge connector used for inserting and fitting the electronic card into a connector of an electronic equipment, the card edge connector comprising:

a connector body having a tip portion with a shape and a dimension corresponding to a card receiving port of said connector of the electronic equipment; and a conductive pad formed in a predetermined pattern on at least one major surface of the connector body;

wherein said conductive pad has a terminating portion at a predetermined distance from the end of said tip portion of the connector body, and wherein, adjacent to said terminating portion of said conductive pad, there is further provided a protective pad consisting of a cured resin or resist material which is formed along with a wiring pattern for said electronic card in the post-fabrication step of the wiring pattern.

13. An electronic card as described in claim 12, wherein said electronic card and said card edge connector are integrally formed in one unit.

14. An electronic card as described in claim 12 or 13, wherein said electronic card is a printed circuit board.

15. An electronic card comprising a card edge connector used for inserting and fitting an electronic card with an electronic device packaged thereon into a connector of an electronic apparatus, the card edge connector comprising:

a connector body having a tip portion with shape and dimension corresponding to a card receiving port of said connector of the electronic apparatus; and a conductive pad formed in a predetermined pattern on at least one of major surfaces of the connector body;

wherein said conductive pad terminating at a predetermined distance from the end of said tip portion of the connector body, and wherein, adjacent to said terminating portion of said conductive pad, there is further provided a protective pad consisting of a cured resin or resist material.

16. An electronic card as described in claim 15, wherein said electronic card and said card edge connector are integrally formed in one unit.

17. An electronic card as described in claim 15 or 16, wherein said electronic card is a printed circuit board.

18. An electronic equipment having an electronic card comprising a card edge connector used for inserting and fitting the electronic card into a connector of the electronic equipment, the card edge connector comprising:

a connector body having a tip portion with shape and dimension corresponding to a card receiving port of said connector of the electronic equipment; and a conductive pad formed in a predetermined pattern on at least one of major surfaces of the connector body;

wherein said conductive pad terminates at a predetermined distance from the end of said tip portion of the connector body, and wherein, adjacent to said terminating portion of said conductive pad, there is further provided a protective pad consisting of a cured resin or resist material which is formed along with a wiring pattern for said electronic card in the post-fabrication step of the wiring pattern.

19. An electronic equipment as described in claim 18, wherein said electronic card and said card edge connector are integrally formed in one unit.

20. An electronic equipment as described in claim 18 or 19, wherein said electronic card is a printed circuit board.

21. An electronic equipment having an electronic card comprising a card edge connector used for inserting and fitting an electronic card with an electronic device packaged thereon into a connector of an electronic apparatus, the card edge connector comprising:

a connector body having a tip portion with shape and dimension corresponding to a card receiving to a card receiving port of said connector of the electronic apparatus; and a conductive pad formed in a predetermined pattern on at least one major surface of the connector body;

wherein said conductive pad has a terminating portion at a predetermined distance from the end of said tip portion of the connector body, and wherein, adjacent to said terminating portion of said conductive pad, there is further provided a protective pad consisting of a cured resin or resist material.

22. An electronic equipment as described in claim 21, wherein said electronic card and said card edge connector are integrally formed in one unit.

23. An electronic equipment as described in claim 21 or 22, wherein said electronic card is a printed circuit board.

* * * * *